US010869367B2

(12) United States Patent
Duncan et al.

(10) Patent No.: US 10,869,367 B2
(45) Date of Patent: Dec. 15, 2020

(54) ELECTROMAGNETIC WAVE REDUCING HEATER

(71) Applicant: Sauna Works Inc., Berkeley, CA (US)

(72) Inventors: Raleigh C. Duncan, Berkeley, CA (US); Andew Kaps, San Francisco, CA (US)

(73) Assignee: Sauna Works Inc., Berkeley, CA (US)

( * ) Notice: Subject to any disclaimer, the term of this patent is extended or adjusted under 35 U.S.C. 154(b) by 0 days.

(21) Appl. No.: 15/806,262

(22) Filed: Nov. 7, 2017

(65) Prior Publication Data

US 2018/0063898 A1 Mar. 1, 2018

Related U.S. Application Data

(63) Continuation of application No. 13/427,899, filed on Mar. 23, 2012, now Pat. No. 9,844,100.

(60) Provisional application No. 61/467,884, filed on Mar. 25, 2011.

(51) Int. Cl.
*H05B 6/44* (2006.01)
*G01R 21/02* (2006.01)

(52) U.S. Cl.
CPC .................................... *H05B 6/44* (2013.01)

(58) Field of Classification Search
CPC ............ H05B 6/80; B65B 63/08; G01R 21/02
USPC ....... 219/212, 213, 528, 529, 548, 549, 545, 219/466.1, 554, 600, 505; 338/211, 212, 338/312, 255, 275, 276, 308; 324/95, 324/119, 142; 392/432, 416, 435, 436, 392/437
See application file for complete search history.

(56) References Cited

U.S. PATENT DOCUMENTS

| | | | | |
|---|---|---|---|---|
| 2,146,977 | A | 2/1939 | Emil | |
| 2,416,977 | A | 3/1947 | Brown et al. | |
| 5,023,433 | A * | 6/1991 | Gordon | A01K 1/0158 219/545 |
| 5,081,339 | A † | 1/1992 | Stine | |
| 5,296,686 | A | 3/1994 | Ullrich et al. | |
| 5,304,767 | A † | 4/1994 | McGaffigan | |
| 5,761,377 | A | 6/1998 | Wolfe et al. | |
| 6,300,597 | B1 | 10/2001 | Lee | |
| 6,528,770 | B1 † | 3/2003 | Akel | |
| 6,734,404 | B2 † | 5/2004 | Hays | |
| 7,120,353 | B2 † | 10/2006 | Schaeffer | |
| 9,844,100 | B2 | 12/2017 | Duncan et al. | |
| 2003/0031471 | A1 | 2/2003 | Schneider et al. | |

(Continued)

FOREIGN PATENT DOCUMENTS

| | | | |
|---|---|---|---|
| CN | 201639794 U | † | 11/2010 |
| CN | 101945508 A | † | 1/2011 |

(Continued)

OTHER PUBLICATIONS

"U.S. Appl. No. 15/226,756, Non Final Office Action dated Jul. 6, 2018", 14 pages.

(Continued)

*Primary Examiner* — Quang T Van
(74) *Attorney, Agent, or Firm* — Kwan & Olynick LLP

(57) ABSTRACT

A heater with reduced electromagnetic wave emissions, comprising two heating elements separated by an insulating layer and receiving opposite-phase alternating current in a way that cancels out electromagnetic wave emissions.

5 Claims, 4 Drawing Sheets

(56) References Cited

U.S. PATENT DOCUMENTS

| | | | |
|---|---|---|---|
| 2003/0156831 | A1 † | 8/2003 | Schaeffer |
| 2006/0289463 | A1 | 12/2006 | Kil |
| 2007/0110413 | A1 | 5/2007 | Konishi |
| 2008/0143249 | A1 * | 6/2008 | Lee ..................... H01L 51/5231 313/504 |
| 2009/0279879 | A1 | 11/2009 | Zenteno et al. |
| 2010/0072892 | A1 | 3/2010 | Watanabe et al. |
| 2012/0241440 | A1 | 9/2012 | Duncan et al. |
| 2013/0187066 | A1 | 7/2013 | Heller et al. |
| 2014/0374403 | A1 | 12/2014 | Smith |
| 2019/0110339 | A1 | 4/2019 | Duncan et al. |
| 2020/0100984 | A1 | 4/2020 | Duncan |

FOREIGN PATENT DOCUMENTS

| | | | | |
|---|---|---|---|---|
| CN | 201813563 | U | † | 4/2011 |
| CN | 206237620 | U | | 6/2017 |
| JP | 58008673 | A | | 1/1983 |
| JP | S588673 | A | | 1/1983 |
| JP | 58104503 | A | † | 6/1983 |
| JP | 07312277 | A | * | 11/1995 |
| JP | 10261542 | A | * | 9/1998 |
| WO | 2020113134 | A1 | | 6/2020 |

OTHER PUBLICATIONS

"Advisory Action", Advisory Action U.S. Appl. No. 13/427,899, dated Sep. 27, 2016, 3 pages.

"Final Office Action", Final Office Action, U.S. Appl. No. 13/427,899, dated Aug. 24, 2015, 6 pages.

"Int'l Application Serial No. PCT/US17/45171, Int'l Search Report and Written Opinion dated Oct. 12, 2017", 7 pages.

"Non-Final Office Action", Non-Final Office Action, U.S. Appl. No. 13/427,899, dated Feb. 12, 2015, 5 pages.

"U.S. Appl. No. 13/427,899, Advisory Action dated Jun. 8, 2017", 3 pages.

"U.S. Appl. No. 13/427,899, Final Office Action dated Mar. 31, 2017", 8 pages.

"U.S. Appl. No. 13/427,899, Notice of Allowance dated Aug. 8, 2017", 5 pgs.

Advisory Action U.S. Appl. No. 13/427,899, dated Sep. 27, 2016, 3 pgs.

U.S. Appl. No. 15/226,756, Final Office Action dated Mar. 18, 2019, 16 pgs.

Final Office Action, U.S. Appl. No. 13/427,899, dated Aug. 24, 2015, 6 pgs.

Final Office Action, U.S. Appl. No. 13/427,899, dated Aug. 24, 2015, 7 pgs.

International Application Serial No. PCT/US19/63797, Search Report and Written Opinion dated Feb. 25, 208 pgs.

Non-Final Office Action, U.S. Appl. No. 13/427,899, dated Feb. 12, 2015, 5 pgs.

U.S. Appl. No. 15/806,262, Final Office Action dated Jan. 17, 2019, 16 pages.

U.S. Appl. No. 15/806,262, Non-Final Office Action dated Jun. 20, 2018, 9 pages.

* cited by examiner
† cited by third party

ELECTROMAGNETIC WAVE REDUCING HEATER

CROSS-REFERENCE TO RELATED APPLICATIONS

The present application is a continuation of U.S. patent application Ser. No. 13/427,899, filed Mar. 23, 2012, which claims the benefit of U.S. provisional patent application No. 61/467,884, filed Mar. 25, 2011, which are incorporated herein by reference in its entirety.

FIELD OF THE INVENTION

The present invention relates to heating elements, specifically to a planar electric heating element that has low electromagnetic wave emissions.

BACKGROUND

As crude oil prices surge and remain very high, people are paying more attention to electric heating. Electric heating utilizes either linear heating elements made out of nickel and heating wires, or planar heating elements made of spread carbon microfiber or carbon micro powder. Electric heating makes it easy to control its temperature, does not pollute the air, and is sanitary and noiseless. Because it is quick to heat up and because it emits infrared rays, electric heating is very useful in many applications, such as residential buildings (apartment complexes, homes, and retirement communities), commercial buildings, industrial buildings (work yards, warehouses, and outdoor covered structures), and agricultural buildings.

Planar heating elements are a good way to deliver heat over a large surface. Some such planar heating elements utilize the resistance of carbon itself, which increases the efficiency and benefits of electric heating.

However, even though planar heating elements have many merits, many people are reluctant to use them because of the negative effects of the electromagnetic waves they emit. Electromagnetic waves are generated wherever electricity flows. There has been a suggestion that electromagnetic waves induce anxiety in humans and are harmful to general health. Since planar heating elements are typically used at close range, electromagnetic emissions are a serious concern. While a metal enclosure (or an enclosure made of another conductive material) can shield the user from electromagnetic waves, such an enclosure would severely lower the heat-generating efficiency of a planar heating element, which renders it impractical.

SUMMARY

The present invention drastically reduces electromagnetic wave emissions from a heater by using pairs of heaters, each powered by alternating current in opposite phases. The two heaters are located very close to each other so that the electromagnetic waves coming from one heater are canceled out by the electromagnetic waves coming from the other. The heating efficiency, however, is preserved. While the preferred embodiment of the invention uses planar heating elements, other embodiments may use other heater types, as long as those heater types can be paired in such a way as to cancel out each other's electromagnetic emissions.

In the preferred embodiment, the heating element of the present invention comprises two planar conductive elements, each one connected to electrodes at both poles; a layer of insulation between the two planar conductive elements; an insulation layer on the outside of each planar conductive element; and a means to cancel the electromagnetic fields generated around the planar conductive elements by connecting them to alternating current sources that are opposite in phase with respect to each other. This method of connection reduces the electromagnetic waves generated over the entire surface of the planar heating element, especially over the electrodes where the electromagnetic emissions are the strongest.

LIST OF FIGURES

DETAILED DESCRIPTION OF THE PREFERRED EMBODIMENT

Figure 1:
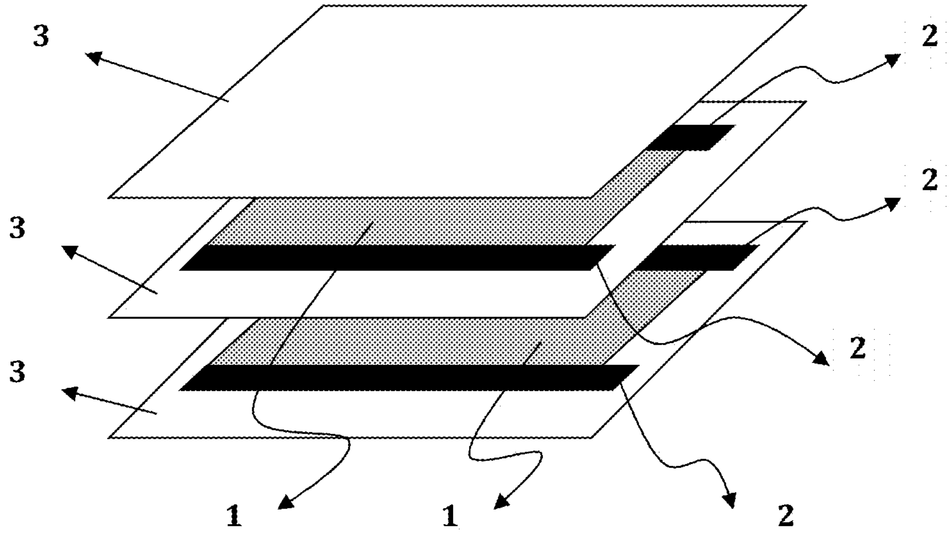
FIG. 1 shows an exploded view of a planar heating element of the present invention.

FIG. 1 shows the preferred embodiment of the invention. Planar conductive elements 1 are connected to electrodes 2. The planar conductive elements can be made of metal, of carbon powder or carbon fibers mixed in a binder and printed, coated, or impregnated on plastic film, fabric, or paper, of carbon fibers mixed in a paper form or carbon felt, or of etched metal foil. The electrodes can be made of either rolled or electrolyzed metal foil. Rolled metal foil is more commonly used thanks to its higher yield strength; a preferred thickness of the metal foil is about 20-60 microns. An insulation layer 3 is placed between the planar conductive elements and on the outside of each planar conductive element. For low-temperature planar heating elements of less than 80° C., polyester or heat-resistant plastic film or sheet is preferable, while for high-temperature planar heating elements of greater than 80° C., high heat resistant hardening resin such as hardening epoxy resin is preferable. The thickness of the insulation layer is preferably 100-200 microns in terms of its insulation characteristics, though it can be greater than 200 microns where excellent insulation characteristics are required. When external wire is connected to copper foil, soldering or wire-connecting terminals are used; the connection must be securely fastened to sustain substantial external force and properly insulated.

Figure 2:
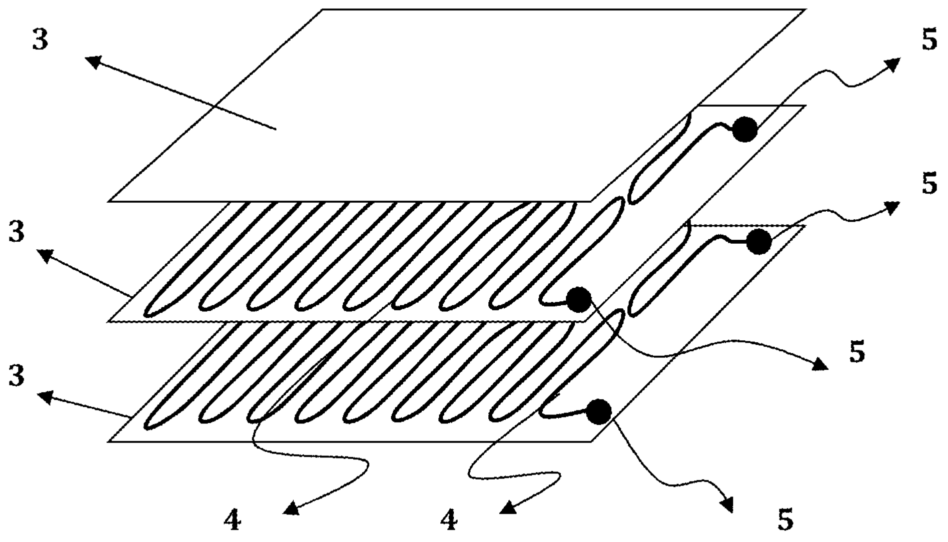
FIG. 2 shows an exploded view of an alternate embodiment of a planar heating element of the present invention.

FIG. 2 shows an alternate embodiment of the present invention, where the planar heating element 4 is made of metal and comprises a wire disposed in a planar fashion over the surface of the insulation 3. The planar heating element 4 is then connected to electrodes 5.

Figure 3:
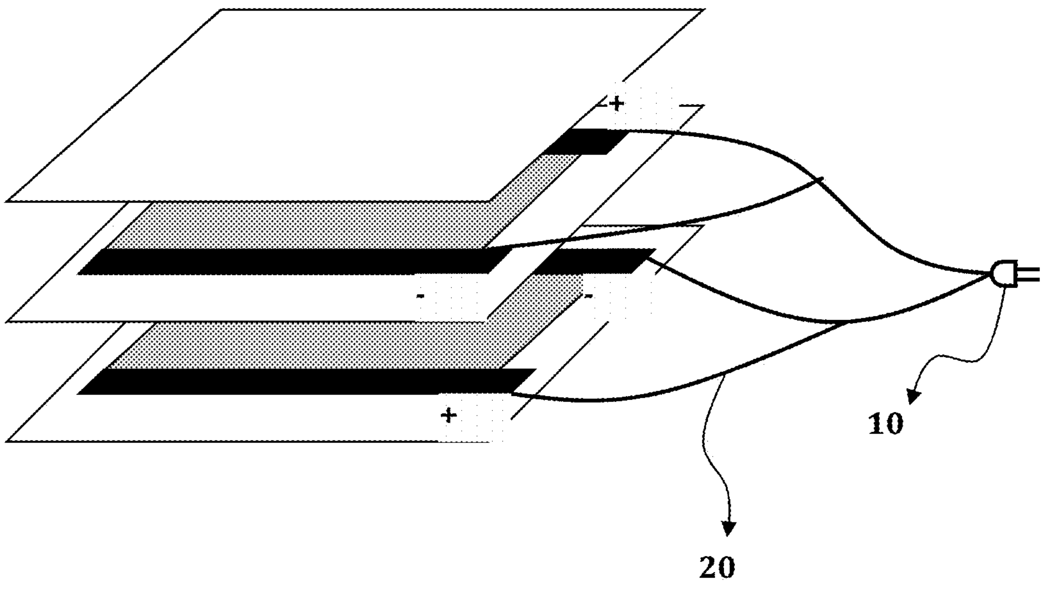
FIG. 3 shows an electrical diagram of a planar heating element of the present invention.
Figure 4:
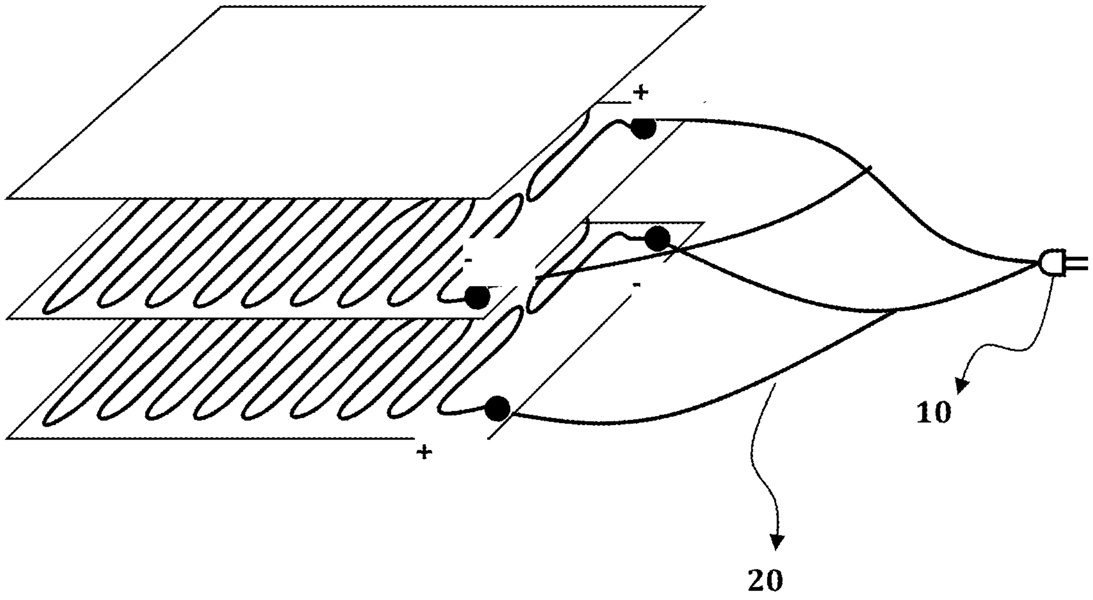
FIG. 4 shows an electrical diagram of an alternate embodiment of a planar heating element of the present invention.

FIGS. 3 and 4 show the electrical design of the preferred embodiment of the present invention. Electrical signal 10 is opposite in phase from electrical signal 20. As a result, the electromagnetic waves that are generated by one planar conductive element are canceled out by the electromagnetic waves generated by the other planar conductive element.

What is claimed is:

1. A heater, comprising:

a plurality of heating elements comprising:

a first heating element configured to generate heat based on a first current;

a second heating element configured to generate heat based on a second current;

at least one insulation layer between at least some of the plurality of heating elements;

wherein the first current has an opposite phase to the second current such that electromagnetic emissions coming from the first heating element are opposite in phase from the electromagnetic emissions coming from the second heating element; and wherein the first heating element and the second heating element are coupled to first electrodes and second electrodes, wherein the first electrodes and the second electrodes comprise metal foil having a first thickness that is less than a second thickness of the at least one insulation layer, and are located at a relative position and distance with respect to each other such that the electromagnetic emissions coming from the first heating element and first electrodes are cancelled out by the electromagnetic emissions coming from the second heating element and second electrodes.

2. The heater of claim 1, wherein the plurality of heating elements comprises planar heating elements.

3. The heater of claim 1, wherein the plurality of heating elements is made of metal.

4. The heater of claim 1, wherein the plurality of heating elements is made of a material impregnated with carbon particles.

5. The heater of claim 1, wherein the first electrodes are coupled to poles of the first heating element, and wherein the second electrodes are coupled to poles of the second heating element.

* * * * *